(12) United States Patent
Schulze et al.

(10) Patent No.: US 7,150,946 B2
(45) Date of Patent: Dec. 19, 2006

(54) METHOD FOR THE REPAIR OF DEFECTS IN PHOTOLITHOGRAPHIC MASKS FOR PATTERNING SEMICONDUCTOR WAFERS

(75) Inventors: Steffen F. Schulze, Sherwood, OR (US); Enio L. Carpi, Round Rock, TX (US)

(73) Assignee: Infineon Technologies AG, Munich (DE)

( * ) Notice: Subject to any disclaimer, the term of this patent is extended or adjusted under 35 U.S.C. 154(b) by 205 days.

(21) Appl. No.: 10/753,604

(22) Filed: Jan. 8, 2004

(65) Prior Publication Data

US 2005/0153213 A1    Jul. 14, 2005

(51) Int. Cl.
  *G03F 9/00*     (2006.01)
  *G03C 5/00*     (2006.01)
(52) U.S. Cl. .......................... 430/5; 430/394
(58) Field of Classification Search ............ 430/5, 430/394; 204/192.33, 192.34
  See application file for complete search history.

(56) References Cited

U.S. PATENT DOCUMENTS

| 5,468,337 | A | * | 11/1995 | Miyatake | 216/24 |
| 5,561,010 | A | * | 10/1996 | Hanyu et al. | 430/5 |
| 5,807,650 | A | * | 9/1998 | Komano et al. | 430/5 |
| 5,885,735 | A | * | 3/1999 | Imai et al. | 430/5 |
| 6,103,430 | A | * | 8/2000 | Yang | 430/5 |
| 6,562,522 | B1 | * | 5/2003 | Yan | 430/5 |

* cited by examiner

*Primary Examiner*—S. Rosasco
(74) *Attorney, Agent, or Firm*—Slater & Matsil, L.L.P.

(57) ABSTRACT

A method for repairing defects in a photolithographic mask for use in patterning semiconductor wafers introduces a pre-selected phase error selected to sum with a phase error of a defect repair material, yielding a desired composite phase error relative to light passing through the substrate alone, e.g., 180°. Substrate phase error may be introduced by modifying its thickness. For example, after any opaque layer material within a repair zone surrounding the defect is removed, the substrate, too, is removed within the repair zone to a pre-selected depth, forming a lacuna. Repair material is then deposited in the lacuna and in the remainder of the repair zone to a level substantially equal to the top surface of the opaque layer, yielding a desired, combined phase error and attenuation matching those of defect free regions of the mask where the opaque layer has not been removed.

25 Claims, 3 Drawing Sheets

METHOD FOR THE REPAIR OF DEFECTS IN PHOTOLITHOGRAPHIC MASKS FOR PATTERNING SEMICONDUCTOR WAFERS

FIELD OF THE INVENTION

The present invention relates generally to optical masks for use in the fabrication of semiconductor wafers and, in particular, to the repair of defects in such masks.

BACKGROUND

A key step in the fabrication of semiconductor wafers is the patterning of wafer layers using photolithography. In brief, photolithography involves the selective exposure of the wafer being fabricated to light having particular frequency and energy characteristics. The wafer usually will have been pre-treated with so-called "photo-resist" or other suitable chemical. When exposed to light, the photo-resist undergoes a chemical change that modifies its ability to be removed from the wafer. In order to form patterns in wafer layers, photo-resist is selectively exposed to light by means of an optical mask bearing the desired pattern. The exposed photo-resist can then be selectively removed in order to generate a pattern in the wafer having features that, in the ideal case, exactly duplicate those of the optical mask. Subsequent etch or deposition of the wafer can then be performed in those areas where the photo-resist has been removed.

The extreme miniaturization of features in semiconductor devices places an absolute premium on the accuracy of the steps involved in their fabrication, as well as on freedom from even small errors in each step. These errors may tend to arise as a result of a number of factors and are difficult to prevent. Contaminations during the fabrication of photomasks, for example, as well as embedded impurities in substrates, resists, or other involved materials, may give rise to defects in the mask after the patterning process. As a result, the repair of defects in photolithography masks necessarily turns out to be a regular phase of the manufacturing process.

A photolithography mask typically has comparatively transparent portions, through which light is intended to pass to the wafer being patterned, and comparatively opaque portions, through which no light is intended to pass. Mask defects therefore fall into two categories: "clear defects," in which a clear or transparent area has been created in a region on the mask that was supposed to remain opaque; and "opaque defects," in which an area intended to be transparent has instead been caused to become comparatively opaque to the transmission of light. Because photomasks can be expensive to create and are expected to be used repeatedly, yet may be subject during their use to insults leading to the creation of defects that would otherwise render them unusable, it can be far more economical to repair the masks than be forced to replace them.

Indeed, defects arise as a result of the very manufacture of the mask itself. Since the mask is a "negative" or an original, a zero-tolerance is applied against defects of a certain size. Repair is a fixed part of the standard mask-making flow.

Most photolithography masks employ two primary layers: (1) a transparent. e.g., glass, substrate layer having high light transmittance; and (2) a masking, opaque layer having a lower transmittance. Depending upon the type of photolithographic mask, of which there are several, the transmittance of the opaque layer may actually be other than non-zero. In certain attenuated phase shift masks, for example, the opaque attenuator layer may have a transmittance of approximately 6%. Other phase shift masks may have different transmission, such as a high transmittance of 17%, for one example.

Not only is the transmittance of each of the mask layers important, but so is the index of refraction, which imparts a phase-shift to any light passing through the material. In an attenuated phase shift mask, for example, the opaque layer is selected to have such a thickness and index of refraction that it brings about a 180° phase angle of the light it transmits relative to light that passes through the glass substrate layer alone. In some attenuated phase shift masks, molybdenum silicide is used to form the attenuator.

As the size of features of integrated circuit devices continues to shrink, a premium is placed on the ability to resolve a projected light image onto a photo-resist layer to the greatest extent possible. The phase angle of light passing through the substrate and the attenuator, as opposed to the substrate alone, therefore has great practical importance. In an attenuated phase shift mask, for example, a 180° degree phase angle between the attenuated and unattenuated light leads to a maximal contrast—and therefore resolution—of the light on the photo-resist. This is because, at the interface between the attenuator and non-attenuator regions of the mask where interference is apt to occur, the 180° phase angle leads such interfering light waves to destructively interfere and thereby cancel one another. This approach, and others, thereby make it possible to create crisply defined features on the photo-resist material and, by extension, on the semiconductor device itself.

Opaque defects are typically treated through the application of a focused laser or ion beam, during which the residual material evaporates or is sputtered away. In the case of clear defects, on the other hand, a material needs to be deposited. The choice of material to be used for the deposit is driven mainly by the demand for a local and accurate placement of the material out of the gas phase. For binary masks, the only requirement regarding optical performance is a transmittance that is close to zero.

In the case of attenuated phase shift masks, in which the mask material is, for example, molybdenum silicide ($MoSi_2$) or other suitable material, the situation is different. The masking material in attenuated phase shift masks actually transmits a certain amount of light, but also introduces a phase shift, relative to the fully transparent areas, of 180 degrees.

The task of repairing a clear defect is therefore a complicated one. Depositing $MoSi_2$ is not technically feasible. Rather, the most common repair techniques use carbon-based material, although other suitable materials, such as zirconium oxide-based materials, may also be used. As result of using a material different from the surrounding mask material, the transmission and the phase associated with a repair site generally will not match the surrounding masking material. This disparity, in turn, leads to critical dimension (CD) errors associated with the repaired feature after wafer exposure. Adjusting the thickness of the repair patch may make it possible to match at least the transmission at the repair site, but a phase error remains.

With known approaches to the repair of attenuated phase shift masks, which typically employ the deposition of a comparatively opaque carbon-based or other suitable material at the defect site, if the material is deposited with care at a particular thickness, it is possible to match the transmittance of the repair material with that of the attenuator. The differing optical properties of the repair material relative to the attenuator generally make it difficult or impossible simultaneously to match the phase of the attenuator. As a result, although the intensity of light transmitted through the repair region might be properly corrected, the phase is not, and the interference that occurs at the interface between the repair region and those regions that adjoin it will not be destructive interference. The resolution of features in the vicinity of the repair can therefore be expected to be lower than the degree of resolution expected of the photolithographic mask prior to the defect.

There is, therefore, an unmet need for a method of repairing defects in photolithographic masks, such as attenuated phase shift masks, that permits both the transmittance as well as the phase of the light passing through the repair to match those of the light passing through the area of the defect prior to the repair.

SUMMARY OF THE INVENTION

The present invention, in its various aspects, is directed to addressing the unmet needs described above by providing a method for repairing defects in photolithographic masks that introduces a pre-selected phase shift (which also may be referred to as a "phase angle" or "phase error") in the substrate material. The pre-selected phase angle, in turn, permits a repair, such that light transmitted through the mask at a repair site has a phase angle and transmission substantially similar to the phase angle and transmission as if there were no such defect.

One aspect of an embodiment of the present invention provides a method for repairing a defect in a photolithography mask for semiconductor patterning. The photolithographic mask has a first layer with a first light transmittance and a second layer with a second light transmittance, differing from the first. The second layer is removable in at least one pre-selected region to form a pattern. When intact, the second layer causes a phase shift in light waves that pass through it relative to light passing through the first layer alone. The absence of the second layer in a region that is not a subset of the pattern constitutes a defect. The method comprises the steps of identifying the location of the defect and introducing a pre-selected phase change at substantially the defect location.

An embodiment of another aspect of the present invention is a photolithography mask for use in the fabrication of integrated circuits. The photolithography mask comprises a first layer and also has a second layer with a primary and substantially constant thickness as well as a region of un-altered thickness, the altered thickness causing a pre-selected phase shift in light passing through it relative to the phase of light incident upon the region of altered thickness. In this embodiment, the region of altered thickness in the second layer is not a penetration through or hole formed in the second layer.

Another embodiment of an aspect of the present invention provides a method for repairing a clear defect in a photolithography mask. The mask has a first substantially transmitting layer and a second layer having lower transmittance than the first. The clear defect has a known location. The method comprises the step of introducing a phase shift due to the first layer substantially at the location of the defect.

An embodiment of another aspect of the present invention provides a method for patterning a wafer for use in a semiconductor circuit. The method includes the steps of providing a photolithographic mask for producing a pattern on a wafer, identifying a defect in the photolithographic mask and the location of the defect on the mask, introducing a pre-selected phase change at substantially the location of the defect, repairing the defect, and transmitting light through the photolithographic mask to the wafer to pattern the wafer.

An embodiment of still another aspect of the present invention provides a semiconductor wafer comprising a surface patterned using a photomask having a defect repaired by introducing a pre-selected phase change at substantially the location of the defect. The resulting wafer surface pattern comprises a feature formed at least in part by light passing through the repaired defect.

DETAILED DESCRIPTION

The various aspects of the present invention are directed to methods for repairing defects in phase shift masks, the resulting repaired masks, and semiconductor wafers and devices having superior construction resulting from the methods of the invention.

According to an aspect of the present invention, a repair process for a phase shift mask involves matching both the transmission as well as the phase of the surrounding masking material. The process, without limitation, introduces a phase shift error at the future repair site prior to deposition of the repair material. This way, the combined phase and transmission effect of the repaired location matches the surrounding opaque layer, whether $MoSi_2$ or other material, in terms of optical behavior and does not cause critical dimension variations on the wafer.

Figure 1:
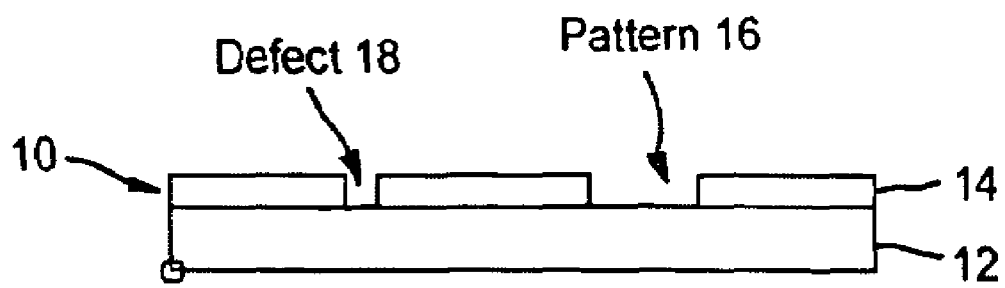
FIG. 1 shows in cross-section a known phase shift mask for semiconductor photolithography patterning, the mask having a pattern and a defect.

FIG. 1 shows, in schematic form, a known phase shift photolithography mask 10, comprising a transparent glass substrate layer 12 and a comparatively opaque masking layer 14. In practice, the masking layer 14 of a phase shift mask has a known transmittance. As shown, masking layer 14 has been intentionally removed in certain pre-selected areas collectively referred to as a pattern, a portion of which is shown in the Figure at reference numeral 16. In the formation of masking layer 14 and pattern 16, or thereafter, defects can occur. One type of defect is called an opaque defect. An opaque defect involves the deposition of masking material, of the sort comprising masking layer 14, in parts of pattern 16. Where light is supposed to pass through to the wafer unimpeded, the presence of an opaque defect will occlude such transmission, causing a corresponding defect in the wafer being patterned. Since an opaque defect generally is attributable to the deposition of material, it is generally possible to remove such opaque material using a laser without necessarily affecting the underlying substrate layer 16. The second type of defect, known as a transparent defect, arises where a portion of the masking layer 14 is unintentionally removed. This type of defect, shown at reference numeral 18, is particularly addressed by the present invention, although embodiments of the method of the invention could be applied to the repair of defects generally.

Figure 2:
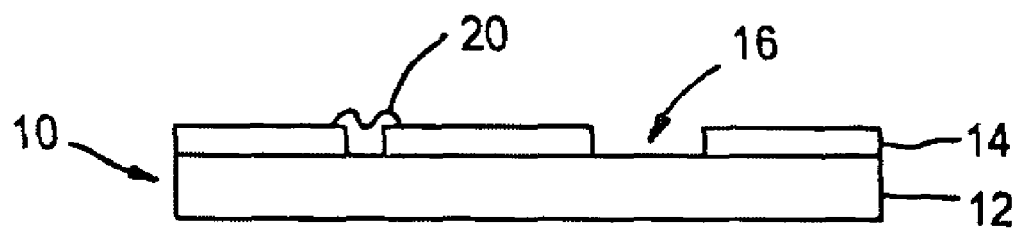
FIG. 2 shows a phase shift mask of the type shown in FIG. 1, also in cross-section, and having a defect that has been repaired according to an existing approach.

Existing methods for repairing transparent defects generally take the form shown in FIG. 2. There, the defect has been repaired through the deposition of a repair material or patch 20. Repair material 20, as described above, often comprises a carbon-based or other suitable material, the deposition of which leads to transmission and phase shifting of incident laser light differing from that of the surrounding regions of phase shift masking layer 14. This, in turn, leads to a critical dimension error (CD-error) in the fabricated wafer. Even if the thickness of repair material 20 could be modified so that the transmission of light through the patch were to match the surrounding masking layer 14, a phase difference or error relative to the light passing through such surrounding area would nevertheless remain. This phase error, in turn, can lead to defects in the wafer undergoing patterning.

Figure 3:
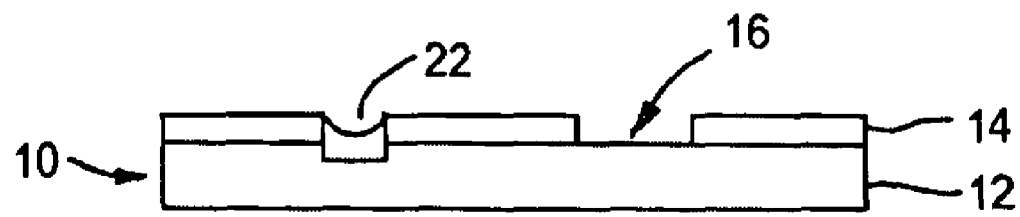
FIG. 3 shows a phase shift mask of the type shown in FIG. 1, in cross-section, having a defect repaired according to an approach embodying a method according to the present invention.

A solution to this problem, in an embodiment of a method and a resulting structure according to the present invention, is shown in FIG. 3. There, rather than simply deposit a repair material 20 of the sort shown in FIG. 2, a preliminary step is taken that intentionally introduces a pre-selected phase error at the future repair site prior to the deposition of repair material. In the illustrated embodiment, this phase error is introduced by removing a portion of the glass substrate 12 to a certain depth. Removal can be effected by any known, suitable method including, without limitation, local etch, sputtering, full lithography/etch cycle or other method. When the repair material 22 is deposited, the combined phase and transmission effect of the repaired location matches the surrounding material in terms of its optical behavior and does not cause CD variations on the underlying wafer (not shown). Methods for intentionally introducing a pre-selected phase error prior to defect repair material deposition, including those other than removing the glass substrate to a known depth, also are within the scope of the present invention as defined in the appended claims. Among such methods are adding material (e.g., without limitation, glass or other suitable material like that of the transmitting layer) sufficient to introduce the desired phase shift. The added material can comprise more than one layer, consistent with overall repair and design objectives and constraints.

Figure 4:
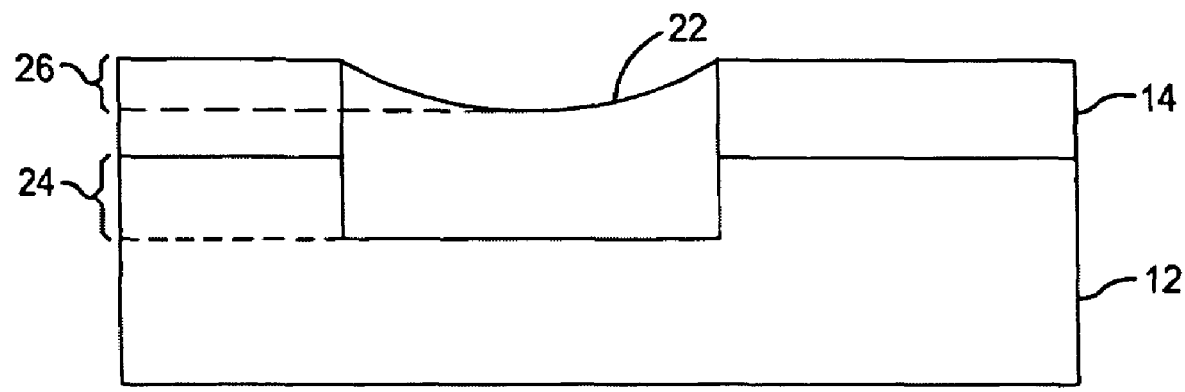
FIG. 4 shows the cross-section of the phase shift mask of FIG. 3, and certain of its dimensions, in greater detail.

FIG. 4 shows, at closer range, the repair depicted schematically in FIG. 3. FIG. 4 in particular highlights the removal of substrate 12 to a depth 24 to form a lacuna, the depth 24 selected as a function of the transmittance and thickness of the substrate 12 as well as that of the repair material. Equipped with this inventive concept and existing known methods for computing transmittance and phase change through two materials, those of substrate layer 12 and masking layer 14, one can solve for the appropriate dimension 24 that will lead to a pre-selected phase change, such that the sum of this phase error or change, and the phase change due to repair material 22, produces a desired total phase change relative to the phase change attributable to the substrate layer 12 alone. In computing a value for dimension 24 of the lacuna to be formed in the substrate, account is preferably taken of dimension 26, which arises in the formation of the repair. In this embodiment, rather than leave a repair having a complicated surface structure as in the prior art, represented in FIG. 2, a smooth concave surface is imparted in repair 22. The depth of this concavity, dimension 26, plays a role in identifying an appropriate corresponding dimension 24, the depth of the lacuna to be formed in substrate 12.

Figure 5:
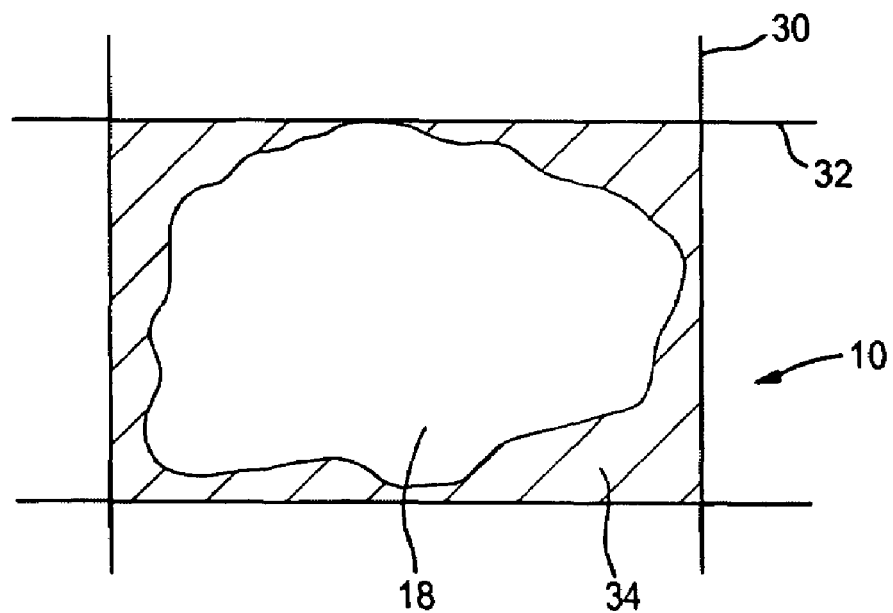
FIG. 5 shows a phase shift mask of the type shown in FIG. 1, here in plan view, focusing on the defect and an embodiment of a method for repairing it.

The repair can be made, according to an embodiment of a method according to the present invention, as shown in FIG. 5. In that figure, phase shift mask 10, having defect 18, is shown in plan view. Light-occlusive structures, such as blades 30 and 32, are positioned relative to the defect 18, to enable removal (e.g., by laser) of a regular, predictable and known area. In order to minimize the dimensions of the repair zone, and therefore the energy expended in preparing it, light-occlusive structures 30 and 32 are positioned so that defect 18 is only just inscribed within the frame that the those structures define. Although blades forming a quadrilateral may presently be the most convenient manner of defining a repair area, other methods and alternative repair area geometries are also within the scope of this aspect of the present invention.

In FIG. 5, when the light-occlusive structures 30 and 32 have been positioned such that defect 18 is just inscribed within the frame that they form, an area 34 initially remains where opaque material is present. It is the total area within the blades 30 and 32, also comprising the sum of the areas of defect 18 and area 34—the sum referred to here as the repair zone—that is preferably minimized. When the opaque or attenuator material 14 in the repair zone has been removed, which can be performed according to known methods, the repair zone is then of precisely known location and dimensions, and preferably of regular geometry, in the plane represented in the figure, facilitating the eventual deposition of the repair material with increased accuracy. Of course, as described above, removal of the opaque material 14 remaining within the frame defined by the occlusive structures is done by applying energy sufficient to produce a depth 24 in the substrate 12 and, with it, the desired phase error. The depth 24 can also be selected to lead to a thickness of the repair material 22 that results in a desired transmittance, preferably one matching the transmittance of opaque layer 14.

The light-occlusive structure 30 and 32 need not comprise blades or necessarily define a frame that is rectilinear. Other linear and curvilinear occlusive structures can also be used within the scope of this aspect of the present invention, to produce a corresponding rectilinear or curvilinear repair zone.

Figure 6:
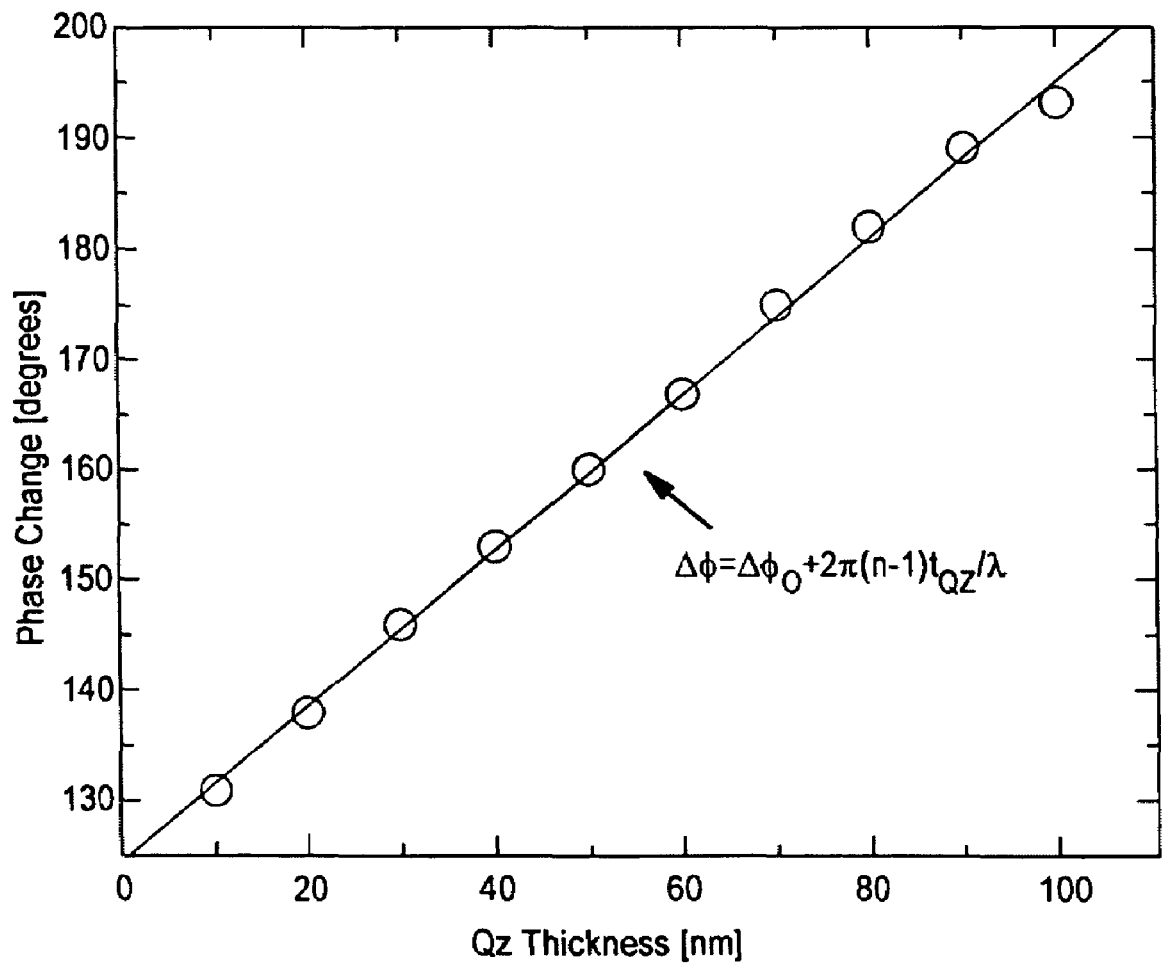
FIG. 6 shows a graph of a relationship between phase change, in degrees, of light passing through quartz, as a function of the thickness of the quartz in nanometers.

FIG. 6 shows a graphic depicting a relationship between a phase change of light waves passing through a substrate and the thickness of that substrate. The thickness of a material for the substrate 12 (here quartz) is shown on the X axis in nanometers, while a corresponding phase change, in degrees, is shown on the Y axis as a function of the thickness of substrate 12. The phase change relationship, determined empirically, can be described by the function:

$$\Delta\Phi = \Delta\Phi_0 + 2\pi(n-1)t_{QZ}/\lambda$$

where $\Delta\Phi_0$ is the phase angle of the light incident on the substrate relative to a reference phase angle, n is refractive index of the material—quartz, $t_{QZ}$ the depth (thickness) of the removed material of the quartz substrate, and $\lambda$ is the wavelength of the light.

Referring again to FIG. 4, knowing the thickness of the substrate 12 and the attenuator or opaque material 14 and the typical magnitude 26 of the concavity of the repair, it is possible to compute the thickness of the repair material 22 above the substrate. Then, knowing the material of the substrate (e.g., quartz) and the material of which the repair 22 is to be made, and therefore their respective transmittivities and indices of refraction, it is possible to solve for the thickness 24 of the substrate material to be removed that will lead to (1) a total thickness of the repair material that will produce the desired attenuation; and (2) a total phase change (having a repair component and a reduced-thickness ubstrate component) that matches the phase change through the combined, full-thickness attenuator and substrate. There is believed always to be a unique solution.

An approach using similar principles can be applied analogously in embodiments of the present invention involving the repair via the addition of material (e.g., similar to the transparent layer) whether in one or more layers, the key being to introduce a pre-selected phase shift as described above.

Wafers patterned using the photomasks and/or methods according to the present invention have improved structure at, and in the vicinity of, regions corresponding to those in the photomask where a defect has been corrected according to the present invention. Such patterned wafers according to the present invention, it is believed, would be structurally distinguishable in a side-by-side comparison from wafers patterned without the benefit of the present invention.

While the invention has been particularly shown and described with reference to particular embodiments, those skilled in the art will understand that various changes in form and details may be made without departing from the spirit and scope of the invention as set forth in the appended claims.

What is claimed is:

1. A method for repairing a defect in a photolithographic mask for semiconductor patterning, the photolithographic mask having a substrate or first layer of a first material with a first thickness and a first light transmittance and a second layer of a second material having a second light transmittance differing from the first, the second layer being removable in at least one pre-selected region to form a pattern, the second layer, when intact, causing a selected phase shift in light waves that pass through it relative to light passing through the first layer or substrate alone, and, when absent in a region not a subset of the pattern, constituting the defect, the method for repairing said defect comprising the steps of:
    identifying the location of the defect;
    modifying said first thickness of said substrate or first layer in an area that includes said defect to a selected second thickness to introduce a pre-selected phase change in said area that includes the defect location; and
    depositing a repair material different than said first layer and having a pre-selected index of refraction to a selected thickness over said modified area of said first layer such that light passing through said deposited material having said selected thickness and said second thickness of said first layer has a phase shift substantially equal to said selected phase shift.

2. The method according to claim 1, wherein the step of modifying the thickness of the first layer comprises reducing said thickness.

3. The method according to claim 2, wherein the reduction in thickness of the first layer comprises a lacuna in the first layer and wherein the deposited material fills the lacuna to a depth having an average value substantially equal to a pre-selected value.

4. The method according to claim 3, wherein the selected thickness of the deposited material is a function of at least one physical characteristic of the material of the first layer.

5. The method according to claim 3, wherein the selected thickness of the deposited material is a function of at least one physical characteristic of the material to be deposited and an at least one physical characteristic of the material of the first layer.

6. The method according to claim 3, wherein the transmittance and index of refraction of the deposited material and the depth of the lacuna are selected to so that light of a known intensity and phase passing through the repair zone following deposition of the material will have a pre-selected intensity, and a pre-selected phase angle relative to a reference phase angle, upon emerging from the photolithographic mask.

7. The method according to claim 1, wherein the step of modifying the thickness of the first layer comprises causing an increase in thickness by applying a material of known transmittivity.

8. The method according to claim 7, wherein the applied material of known transmittivity comprises more than one layer, each being of a material having known transmittivity.

9. The method according to claim 1, comprising the further step, prior to modifying the thickness of the first layer, and removing a portion of the second layer adjacent the defect to create a repair zone.

10. The method according to claim 9, wherein the removal of the portion of the second layer adjacent the defect to create the repair zone comprises removing a portion of the second layer having regular geometry.

11. The method according to claim 10, wherein the regular geometry comprises at least one rectangle.

12. The method according to claim 10, wherein the regular geometry comprises at least one curvilinearly shaped portion.

13. The method according to claim 1, wherein the step of depositing a material comprises depositing a material having a pre-selected transmittance.

14. The method according to claim 1, wherein the selected thickness of the deposited material is a function of at least one physical characteristic of the deposited material.

15. The method according to claim 1, wherein the pre-selected phase of the light emerging from the photolithographic mask is at a phase angle of substantially 180 degrees relative to the light incident on the photolithographic mask.

16. A method for patterning a wafer for use in a semiconductor circuit, the method comprising the steps of:
    providing a photolithographic mask for producing a pattern on the wafer, said photolithographic mask having a first substrate or layer of a first material with a first thickness and a first light transmittance and a second layer of a second material having a second light transmittance differing form the first, the second layer being removable in selected areas to form a pattern and wherein an intact second layer causes a selected phase shift with respect to light passing through the tint layer alone;
    identifying a defect in the photolithographic mask and the location of the defect on the mask;
    modifying said first thickness of said substrate or first layer in an area that includes said defect to a selected second thickness to introduce a pre-selected phase change in said area that includes the location of the defect;
    depositing a repair material different than said first layer and having a pre-selected index of refraction to a selected thickness over said modified area of said first layer such that light passing through said deposited material having said selected thickness and said modified thickness of said first layer has a phrase shift substantially equal to said selected phase; and
    transmitting light through the photolithographic mask to the wafer to pattern the wafer.

17. The method according to claim 16, wherein the first light transmitting layer comprises a substantially transparent substrate layer.

18. The method according to claim 17, wherein the second light transmitting layer comprises an attenuator layer having substantially lower light transmittivity than the substrate layer.

19. The method according to claim 16, wherein the modification of the thickness of the substrate layer comprises a reduction in thickness of the substrate layer.

20. The method according to claim 19, wherein the degree of the reduction in thickness of the substrate layer is pre-selected as a function of the light transmission characteristic of the repair material.

21. The method according to claim 16, further comprising the step, prior to the step of introducing a pre-selected phase change, of preparing a repair zone substantially at the location of the defect.

22. The method according to claim 21, wherein the repair zone is of a regular geometric shape.

23. The method according to claim 21, wherein the repair zone is of a minimal size capable of circumscribing the defect.

24. The method according to claim 16, wherein the deposited material has a thickness, in a dimension perpendicular to the plane of the photolithographic mask, selected to produce a pre-selected phase change of light passing through the repair location, the phase change due to both to the repair material of that thickness and to the substrate of modified thickness.

25. The method according to claim 24, wherein the substrate and attenuator layers, at sites having no defect, together produce a given phase change and the value of the pre-selected phase change of the light passing through the repair location is chosen to be substantially equal to the phase change due to the substrate and the attenuator layers at sites having no defect.

* * * * *

UNITED STATES PATENT AND TRADEMARK OFFICE
CERTIFICATE OF CORRECTION

PATENT NO.        : 7,150,946 B2
APPLICATION NO.   : 10/753604
DATED             : December 19, 2006
INVENTOR(S)       : Schulze et al.

It is certified that error appears in the above-identified patent and that said Letters Patent is hereby corrected as shown below:

Column 2, line 52; delete "As" insert --As a--
Column 4, line 48; delete "MoSi.sub.2" insert --$MoSi_2$--
Column 8, line 46; delete "form" insert --from--

Signed and Sealed this

Tenth Day of April, 2007

JON W. DUDAS
*Director of the United States Patent and Trademark Office*